(12) United States Patent
Garcia et al.

(10) Patent No.: US 12,249,991 B2
(45) Date of Patent: Mar. 11, 2025

(54) CLOCK GENERATOR CIRCUIT FOR NEAR FIELD COMMUNICATION DEVICE

(71) Applicant: STMicroelectronics France, Montrouge (FR)

(72) Inventors: Laurent Jean Garcia, Le Champ Pres Froges (FR); Marc Houdebine, Crolles (FR)

(73) Assignee: STMicroelectronics France, Montrouge (FR)

( * ) Notice: Subject to any disclaimer, the term of this patent is extended or adjusted under 35 U.S.C. 154(b) by 0 days.

(21) Appl. No.: 18/345,726

(22) Filed: Jun. 30, 2023

(65) Prior Publication Data
US 2024/0014809 A1    Jan. 11, 2024

(30) Foreign Application Priority Data

Jul. 5, 2022   (FR) ........................ 2206796

(51) Int. Cl.
*H03K 3/03*    (2006.01)
*H03K 5/1252*    (2006.01)

(52) U.S. Cl.
CPC ......... *H03K 3/0315* (2013.01); *H03K 5/1252* (2013.01)

(58) Field of Classification Search
CPC .................................................. H03K 3/0315
USPC .......................................................... 331/57
See application file for complete search history.

(56) References Cited

U.S. PATENT DOCUMENTS

| 2002/0039051 A1* | 4/2002 | Ito ........................ H03L 7/0995 331/25 |
| 2013/0002361 A1* | 1/2013 | Coban .................. H03K 3/0315 331/108 R |

FOREIGN PATENT DOCUMENTS

WO    2016179789 A1    11/2016

OTHER PUBLICATIONS

Ahmadi-Farsani, J., et al., "An ultra low-power current-mode clock and data recovery design with input bit-rate adaptability for biomedical applications in CMOS 90 nm," Integration, the VLSI Journal, vol. 62, Jun. 2018, 8 pages.

* cited by examiner

*Primary Examiner* — Joseph Chang
(74) *Attorney, Agent, or Firm* — Slater Matsil, LLP

(57) ABSTRACT

A clock generator circuit includes an oscillator circuit coupled to a bias circuit. The bias circuit includes a current mirror, third and fourth transistors, and a cascode transistor. The current mirror includes a reference transistor and a set of copy transistors that are programmable. The third transistor has a source connected to a cold spot, a drain and a gate connected to this drain. The fourth transistor has a source connected to the drain of the third transistor, a drain, and a gate connected to that drain. The cascode transistor has a source connected to a drain of at least one of the copy transistors, a drain, and a gate connected to the gate of the fourth transistor. The gates of the fourth transistor and the cascode transistor are thicker than the gates of the reference transistor, each copy transistor, and the third transistor.

20 Claims, 2 Drawing Sheets

CLOCK GENERATOR CIRCUIT FOR NEAR FIELD COMMUNICATION DEVICE

CROSS-REFERENCE TO RELATED APPLICATIONS

This application claims the benefit of French Patent Application No. 2206796, filed on Jul. 5, 2022, which application is hereby incorporated herein by reference.

TECHNICAL FIELD

Embodiments and implementations relate to near field communication, for example to a clock generator for a near field communication device.

BACKGROUND

Near field communication (also known by the acronym NFC) is a short distance high frequency wireless communication technology, which allows contactless data exchanges between two devices over a short distance, for example in the order of 10 cm.

NFC is an open technology platform standardized according to ISO/IEC 18092 and ISO/IEC 21481 standards but incorporates many existing standards such as the Type A and Type B protocols defined according to ISO-14443 standard which can be used as communication protocols in NFC technology.

Near field communication can be achieved between a reader and a device emulated in card mode. The reader is then configured to generate a magnetic field through its antenna which is generally according to the standards conventionally used, a sine wave at 13.56 MHz. The strength of the magnetic field is between 0.5 and 7.5 amps/meter root mean square (RMS).

Near field communication can be performed according an active mode of operation. In this mode of operation, both the reader and the device emulated in card mode generate an electromagnetic field. Generally, this mode of operation is used when the device is provided with its own supply source, for example a battery, as is the case in a cellular mobile phone which is then in card emulation mode.

In particular, near field communication can be performed using active load modulation (ALM). Active load modulation allows for signal synchronization between the reader and the device emulated in card mode.

The reader is configured to emit an electromagnetic field, and the device emulated in card mode is configured to modulate an amplitude of the field without beat. In order to respond to the reader, the device emulated in card mode generates a signal synchronized with the reader's field so as to be in phase with the reader's field. It is then also important for the reader to generate a sufficiently stable field to be able to detect small variations in its field as a function of the distance between the reader and the card emulator.

In reader mode or in card emulator mode, it is important that the device generates a clock that is as clean as possible and that ensures communication with a minimum of energy.

To generate a clock, the device includes an oscillator circuit integrated in a phase-locked loop. This oscillator circuit control can be either analog or digital.

An analog phase-locked loop is conventionally used for the reader mode in order to achieve low phase noise to be sensitive to the card.

A digital phase-locked loop is conventionally used for the card emulator mode, as the card emulator mode requires an adjustment of the output phase. In addition, the digital phase-locked loop allows a cleaner, that is less noisy, clock to be generated.

Thus, a near field communication device generally includes two phase-locked loops: an analog phase-locked loop for the reader mode and a digital phase-locked loop for the card emulator mode.

The use of two phase-locked loops induces a significant space occupation for electronic circuits of these two loops in the near field communication device. In addition, the near field communication device has to handle different clock paths, which makes the near field communication device more complex, especially in terms of software and electronic circuit layout.

SUMMARY

Embodiments use a single phase-locked loop to provide the reader mode and the card emulator mode of a near field communication device.

According to one aspect, a clock generator circuit comprises an oscillator circuit configured to generate a clock signal at a given frequency dependent on a supply current to the oscillator circuit. A bias circuit is configured to control the supply current of the oscillator circuit. The bias circuit includes a current mirror comprising a first transistor (called a reference transistor) and a set of second transistors (called copy transistors or output transistors) programmable according to a digital word received as an input of the bias circuit. The bias circuit also includes a third transistor having a source connected to a cold point (e.g., ground), a drain, and a gate connected to this drain, a fourth transistor having a source connected to the drain of the third transistor, a drain and a gate connected to that drain, and a fifth transistor (called a cascode transistor) having a source connected to a drain of the programmable copy transistor, a drain and a gate connected to the gate of the fourth transistor. The gates of the fourth transistor and the cascode transistor are thicker than the gates of the reference transistor, each output transistor, and the third transistor.

Such a bias circuit avoids a limitation of the drain-source voltage of the copy transistors of the current mirror so as to be able to ensure a supply of the oscillator circuit with a current adapted to obtain a desired maximum frequency of the clock signal.

In particular embodiments, the current mirror allows a current to be drawn in a branch of the bias circuit including the cascode transistor and the set of programmable copy transistors. This drawn current is shunted to a branch of the bias circuit including the third transistor and the fourth transistor. In this way, the gate-source voltage of the cascode transistor is the same as the gate-source voltage of the fourth transistor. This makes it possible to obtain a drain-source voltage of the copy transistors equal to a drain-source voltage of the third transistor.

Thus, the bias circuit allows the oscillator circuit to be robustly controlled by the cascode transistor, which is self-regulating.

Such a bias circuit allows a proper operation of the clock generator circuit for a sufficiently large supply voltage range, for example, between 2 Volts (V) and 2.7 Volts.

Such an oscillator circuit allows the clock generator circuit to operate over a wide frequency range.

The clock generator circuit therefore makes it possible to generate a reliable clock that can be used in a phase-locked loop. In particular, a phase-locked loop integrating such a clock generator circuit may be used for an operation in reader mode or card emulator mode of a near field communication device.

In one advantageous embodiment, the reference transistor has a source connected to the cold spot, a drain and a gate connected to a current source. Furthermore, each copy transistor includes a gate connected to the gate of the reference transistor, a source connected to the cold spot and a drain connected to the source of said cascode transistor, each output transistor being configured to be turned on or off according to the digital word received as an input of the bias circuit.

In one aspect, the reference transistor, each output transistor, the third transistor, the fourth transistor, and the cascode transistor are N-type metal-oxide gate field effect transistors.

In one advantageous embodiment, the bias circuit further comprises a sixth transistor and a seventh transistor. The sixth transistor has a source configured to have a supply voltage applied thereto, a drain connected to the drain of the cascode transistor, and a gate connected to its drain. The seventh transistor has a source configured to have said supply voltage applied thereto, a drain connected to the drain of the fourth transistor and a gate connected to the gate of the sixth transistor, the gates of the sixth transistor and the seventh transistor being connected to a gate of an eighth transistor for controlling the supply current of the oscillator circuit. The gates of the sixth transistor, the seventh transistor, and the eighth transistor are thicker than the gates of the reference transistor, each output transistor, and the third transistor.

In one aspect, the eighth transistor has a source configured to have said supply voltage applied thereto, a drain connected to a supply input of the oscillator circuit.

In one aspect, the sixth transistor, the seventh transistor, and the eighth transistor are P-type metal-oxide gate field effect transistors.

In one advantageous embodiment, the oscillator circuit comprises a loop of inverter circuits supplied with said supply current.

In one aspect, each inverter circuit of the oscillator circuit includes transistors having a gate thicker than the gates of the reference transistor, each output transistor, and the third transistor.

In one aspect, the reference transistor, each copy transistor, and the third transistor have a gate thickness in the order of 17 Å (ångström). In particular, these transistors are low-voltage transistors configured to hold a source drain voltage in the order of 1.2 V.

In one aspect, the fourth transistor and the cascode transistor have a gate thickness in the order of 50 Å. In particular, these transistors are high-voltage transistors configured to hold a source drain voltage in the order of 2.4 V.

In one aspect, the sixth transistor, the seventh transistor, and the eighth transistor have a gate thickness in the order of 50 Å. These transistors are therefore high-voltage transistors configured to hold a drain source voltage in the order of 2.4 V.

In one aspect, the transistors of the oscillator circuit have a gate thickness in the order of 50 Å. These transistors are therefore high-voltage transistors configured to hold a drain source voltage of 2.4 V.

According to another aspect, there is provided a near field communication device comprising a phase-locked loop including a clock generator circuit as described above.

BRIEF DESCRIPTION OF THE DRAWINGS

Further advantages and characteristics of the invention will become apparent from the detailed description of embodiments, which are by no means limiting, and the appended drawings in which.

DETAILED DESCRIPTION

Figure 1:
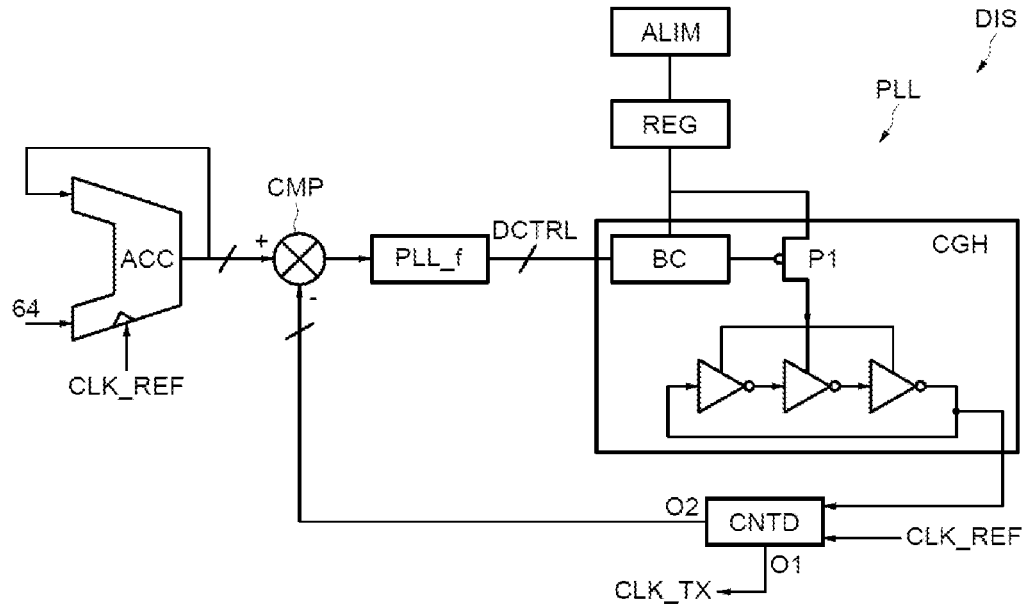
FIG. 1 illustrates a near field communication device.

FIG. 1 illustrates a near field communication device DIS. The near field communication device DIS comprises a phase-locked loop PLL. The phase-locked loop PLL includes an oscillator circuit OC configured to provide a clock signal having a desired frequency.

The near field communication device DIS is configured to receive a first carrier signal CLK_REF having a frequency of 13.56 MHz. This frequency is a reference frequency to which the device DIS aims to synchronize using the phase-locked loop PLL, when communicating from said device to the reader. This first carrier signal CLK_REF is extracted from an electromagnetic field transmitted by the reader and received by said antenna. The extraction of the first carrier signal CLK_REF is performed by a carrier signal extraction circuit (not represented) well known to the skilled person.

The phase-locked loop PLL includes a clock generator circuit CGH including the oscillator OC controlled by a digital word. The oscillator circuit OC is supplied with a low-dropout regulator REG.

The oscillator circuit OC is configured to generate a signal having a frequency which is a multiple of a desired frequency (that is synchronous with the reference frequency signal, for example 13.56 MHz) of an output signal CLK_TX. For example, the oscillator circuit OC may be configured to generate a frequency in the order of 868 MHz (64*13.56 MHz).

The phase-locked loop further includes a divider-counter CNTD for counting a number of rising edges of the signal generated by the oscillator circuit OC. The divider-counter CNTD is configured to divide the frequency of the signal generated by the oscillator circuit OC so as to provide the output signal CLK_TX at the desired frequency via the output O1.

The digital output O2 of the counter-divider CNTD is connected to an inverting input of a comparator CMP. The comparator CMP also includes an input receiving an output from an accumulator ACC. The accumulator ACC has an input receiving a value equal to the value multiplying the desired frequency of the oscillator circuit OC, for example sixty-four. The accumulator ACC also has an input connected to its output. The accumulator ACC takes the reference frequency signal CLK_REF as its clock. The accumulator ACC thus makes it possible to obtain a value equal to the reference phase multiplied by sixty-four.

The output of the comparator CMP corresponds to an error between the phase of the signal generated by the oscillator circuit OC (equal to the frequency of the signal at the output of the phase-locked loop multiplied by sixty-four) and the reference phase multiplied by sixty-four.

The output of the comparator CMP is connected to a loop filter PLL_f configured to generate the digital word to control the clock generator circuit.

Figure 2:
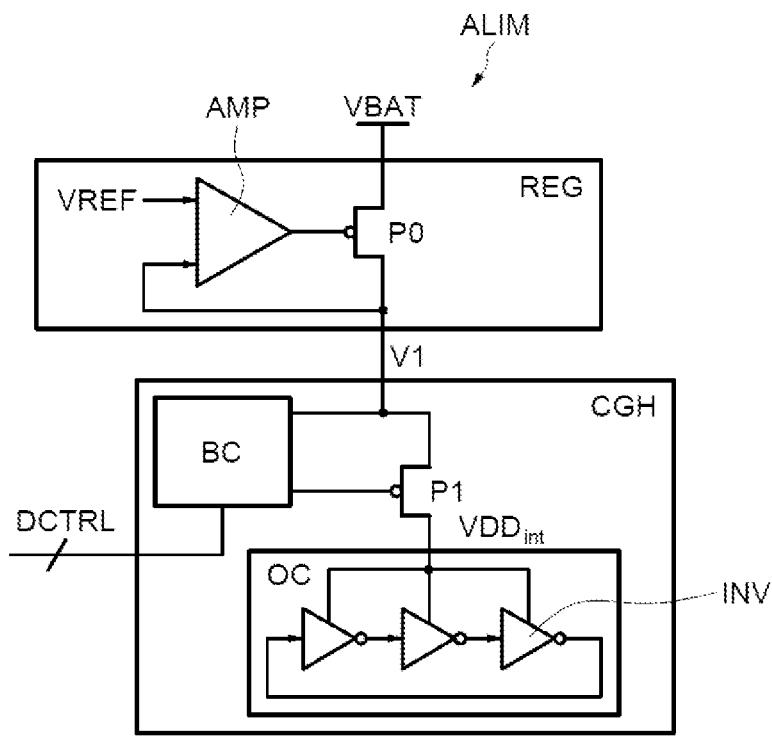
FIG. 2 illustrates a clock generator circuit.

FIG. 2 illustrates a clock generator circuit CGH. The clock generator circuit CGH is supplied with a supply source ALIM, especially a battery, of the near field communication device DIS. The supply source ALIM is configured to generate a voltage VBAT. More particularly, the near field communication device DIS includes a low-dropout regulator REG.

The regulator REG is configured to adapt the voltage VBAT provided by the supply source ALIM in order to obtain a voltage adapted to supply the clock generator circuit CGH. For example, the regulator REG is configured to receive the voltage VBAT, which may vary between 2.6 Volts (V) and 5.5V, and to provide a voltage V1 at 2.4V to the clock generator circuit CGH.

The regulator REG includes a transistor P0, for example of the PMOS type (that is a P-type metal-oxide-semiconductor field effect transistor). Transistor P0 has a source connected to the supply source ALIM, a drain connected to a supply input of the clock generator circuit CGH, and a gate controlled by an operational amplifier AMP.

The operational amplifier AMP has an input, for example a non-inverting input, configured to receive a reference voltage VREF corresponding to the voltage to be applied to the input of the clock generator circuit CGH. This reference voltage VREF can be obtained by a reference voltage generation circuit. The reference voltage generation circuit may be a bandgap voltage reference circuit, well known to the skilled person.

The operational amplifier AMP also has an input, for example an inverting input, connected to the drain of transistor P0.

The operational amplifier has an output connected to the gate of transistor P0.

The operational amplifier AMP is thus configured to control transistor P0 according to a comparison between the supply voltage V1 of the clock generator circuit CGH and the reference voltage VREF so as to obtain a supply voltage V1 of the clock generator circuit equal to the reference voltage VREF.

The clock generator circuit CGH includes a plurality of MOS transistors (that is a field effect transistor with a metal-oxide-semiconductor structure). These MOS transistors have their gates made in varying thicknesses of oxide, referred to as GO1 and GO2 in the following. The difference between the thicknesses of the gate oxides makes it possible to make high-voltage MOS transistors and low-voltage MOS transistors (relatively to each other). The difference in gate oxide thickness between the MOS transistors allows a threshold voltage Vt of these MOS transistors to be changed so as to also change their gate-source voltage VGS. As discussed below, the gate oxide of the transistor GO2 can be about three times greater the gate thickness of the transistor GO1.

In the illustrated embodiment, the MOS transistors GO1 at 1.2V have a gate oxide thickness Tox in the order of 17 Å (ångström), and the MOS transistors GO2 at 2.4V have a gate thickness Tox in the order of 50 Å. In this embodiment, the MOS transistors GO2 have a gate oxide thickness that is about three times greater than the gate thickness of the MOS transistors GO1.

The clock generator circuit CGH includes the oscillator circuit OC and a bias circuit BC for controlling the oscillator circuit OC from a digital word DCTRL.

Figure 3:
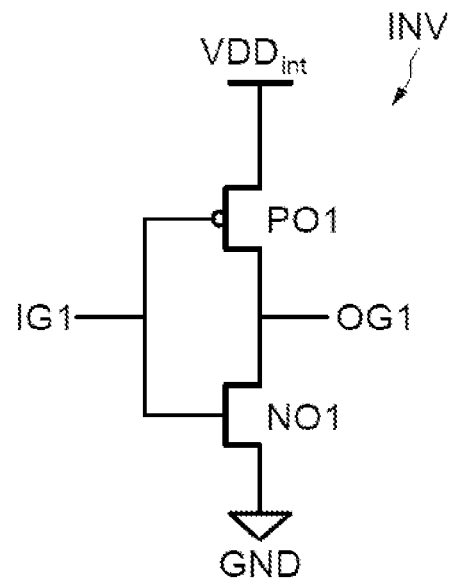
FIG. 3 illustrates an example of an inverter circuit.

The oscillator circuit OC includes an odd number of inverter circuits INV arranged in a closed loop. Each inverter circuit INV has a supply input configured to receive a voltage VDDint. FIG. 3 illustrates an example of an inverter circuit INV. The inverter circuit includes a PMOS type transistor PO1 and an NMOS type transistor NO1 (that is field effect transistor with an N-type metal-oxide-semiconductor structure). Transistor PO1 has a source configured to receive the voltage VDDint, a drain connected to an output OG1 of the inverter circuit INV, and a gate connected to an input IG1 of the inverter circuit INV. transistor NO1 has a source connected to a cold point, especially to a ground GND, a drain connected to the output of the inverter circuit, and a gate connected to the input of the inverter circuit INV. Transistors PO1 and NO1 are of the GO2 type at 2.4V.

The output OG1 of each INV inverter circuit is connected to the input IG1 of an inverter circuit INV placed downstream in the closed loop of the oscillator circuit OC.

The oscillator circuit OC is configured to generate an oscillating signal whose frequency depends on the voltage VDDint applied to the supply inputs of the inverter circuits INV.

The supply input of each inverter circuit INV is connected to the supply input of the frequency generator circuit CGH via a transistor P1, for example of the PMOS type.

Transistor P1 thus has a source connected to the supply input of the clock generator circuit CGH so as to receive the voltage V1, and a drain connected to the oscillator circuit OC. Transistor P1 also has a gate connected to the bias circuit. Transistor P1 is of the GO2 type at 2.4V.

The bias circuit BC controls transistor P1 in order obtain the voltage VDDint as a function of the value of a digital word DCTRL.

In particular, the bias circuit BC comprises an input configured to receive a digital word DCTRL. The digital word DCTRL is provided by the phase-locked loop.

Figure 4:
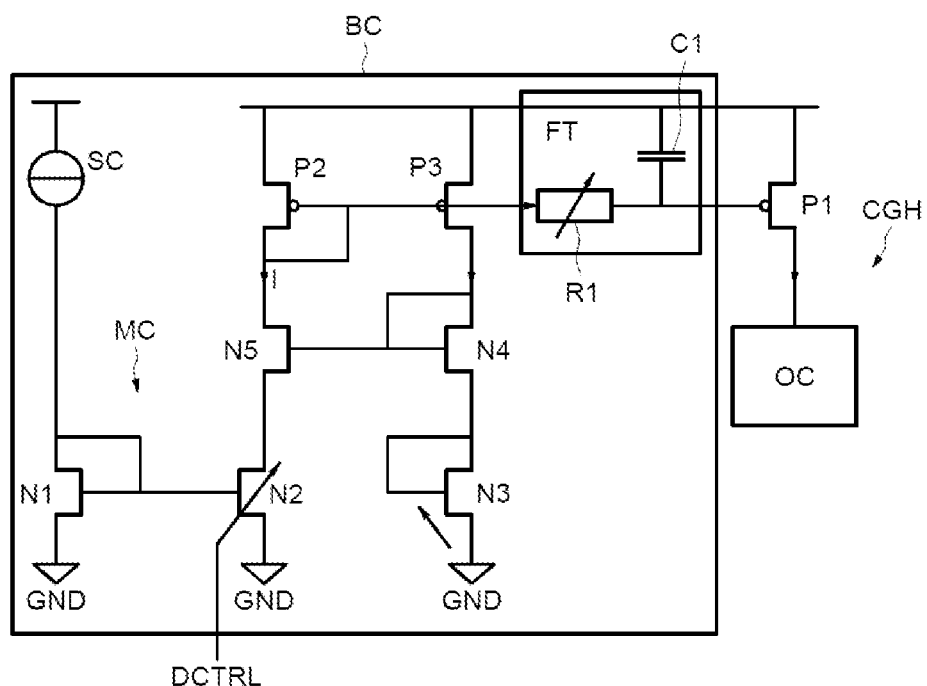
FIG. 4 illustrates a bias circuit that includes a current source and a programmable current mirror.

As illustrated in FIG. 4, the bias circuit BC includes a current source SC.

The bias circuit BC also includes a programmable current mirror MC configured to receive the current provided by the current source SC, and to generate as an output a current I whose ratio to the current of the current source SC is programmable. In particular, the current mirror MC includes a transistor N1, for example of the NMOS type, and a programmable transistor N2, for example of the NMOS type. Transistor N1 has a drain connected to the current source SC, a source connected to a cold point, especially to the ground GND, and a gate connected to the current source SC and to a gate of the programmable transistor N2.

The programmable transistor N2 has a source connected to a cold spot, especially to the ground GND, and a drain for generating the current at the output of the current mirror.

The transistor N2 is programmable as a function of the digital word received as an input of the bias circuit. For this purpose, the programmable transistor N2 can be formed by a plurality of transistors in parallel, each transistor having a gate that can be connected via a switch either to the gate of transistor N1 or to a cold point, especially to the ground GND.

The current generated by the current source SC is defined in such a way as to bias transistor N1 correctly for all variations in the process, voltage, and temperature ("PVT").

Transistors N1 and N2 are of the GO1 type at 1.2V.

The bias circuit BC also includes a transistor N3, for example of the NMOS type. Transistor N3 has a source connected to a cold point, especially to the ground GND, a drain, and a gate connected to its drain. Transistor N3 is a GO1 type transistor at 1.2V.

The transistor N3 has dimensions (width and length) adapted so that the current range does not saturate transistor N3 in any variation of process, voltage and temperature.

The bias circuit BC also includes a transistor N4, for example of the NMOS type. Transistor N4 has a source connected to the drain and the gate of transistor N3, a drain, and a gate connected to its drain.

The bias circuit BC further includes a cascode transistor N5, for example of the NMOS type. The cascode transistor N5 has a source connected to the drain of the programmable transistor N2, a drain and a gate connected to the gate and the drain of transistor N4.

Transistors N4 and N5 are of the GO2 type at 2.4V. In addition, transistors N4 and N5 are identical to within one ratio. Thus, transistors N4 and N5 have the same gate-source voltage VGS.

Transistors N4 and N5 are automatically biased to copy the gate-source voltage VGS of transistor N3 to the drain-source voltage VDS of transistor N2. This reduces or even avoids saturation of transistor N2.

The bias circuit BC also includes a transistor P2, for example of the PMOS type. Transistor P2 has a source connected to the supply input of the clock generator circuit CGH so as to apply the voltage V1 thereto. Transistor P2 also has a drain connected to the drain of the cascode transistor N5, and a gate connected to the drain of transistor P2 and the drain of the cascode transistor N5.

The bias circuit BC also includes a transistor P3, for example of the PMOS type. Transistor P3 has a source connected to the supply input of the clock generator circuit CGH so as to apply the voltage V1 thereto. Transistor P3 also has a drain connected to the drain of transistor N4, and a gate connected to the gate of transistor P2, the drain of transistor P2 and the drain of the cascode transistor N5.

Transistors P2, P3 are of the GO2 type at 2.4V.

The gates of transistors P2 and P3 are also connected to the gate of transistor P1. In particular, transistors P2 and P3 can be connected to the gate of transistor P1 via a filter circuit. The filter circuit FT may comprise a variable resistor R1 and a capacitor C1. Variable resistor R1 then has a first terminal connected to the gates of transistors P2 and P3 and a second terminal connected to the gate of transistor P1. Capacitor C1 has a first terminal connected to the supply input of the clock generator circuit and a second terminal connected to the second terminal of resistor R1 and to the gate of transistor P1.

The bias circuit BC provides robust control of the oscillator circuit OC by means of the self-regulating cascode transistor N5.

The use of a current mirror including GO1 type low-voltage transistors N1 and N2 allows proper operation of the clock generator circuit CGH over a sufficiently large supply voltage range, for example between 2 Volts and 2.7 Volts. This reduces the minimum voltage VBAT for proper operation of the clock generator circuit.

The use of GO2 type transistors for the oscillator circuit OC allows the clock generator circuit CGH to operate over a wide frequency range in a more robust manner.

Thus, the clock generator circuit CGH can generate a reliable clock in a phase-locked loop PLL. A same phase-locked loop PLL can be used to operate the near field communication device DIS in reader mode or in card emulator mode.

What is claimed is:

1. A clock generator circuit comprising:
    an oscillator circuit configured to generate a clock signal at a given frequency dependent on a supply current to the oscillator circuit;
    a bias circuit configured to control the supply current of the oscillator circuit, the bias circuit comprising:
        a current mirror comprising a reference transistor and a set of copy transistors that are programmable according to a digital word received as an input of the bias circuit;
        a third transistor having a source connected to a cold spot, a drain, and a gate connected to the drain of the third transistor;
        a fourth transistor having a source connected to the drain of the third transistor, a drain, and a gate connected to the drain of the fourth transistor; and
        a cascode transistor having a source connected to a drain of at least one of the copy transistors, a drain, and a gate connected to the gate of the fourth transistor, wherein the gates of the fourth transistor and the cascode transistor are thicker than the gates of the reference transistor, each copy transistor, and the third transistor.

2. The circuit according to claim 1, wherein the gates of the fourth transistor and the cascode transistor are about three times thicker than the gates of the reference transistor, each copy transistor, and the third transistor.

3. The circuit according to claim 1, wherein the reference transistor has a source connected to the cold spot, a drain, and a gate connected to a current source, and wherein each copy transistor includes a gate connected to the gate of the reference transistor, a source connected to the cold spot, and a drain connected to the source of the cascode transistor, each copy transistor being configured to be turned on or off according to the digital word received as an input of the bias circuit.

4. The circuit according to claim 1, wherein the reference transistor, each copy transistor, the third transistor, the fourth transistor, and the cascode transistor are N-type metal-oxide gate field effect (NMOS) transistors.

5. The circuit according to claim 1, wherein the bias circuit further comprises:
    a sixth transistor having a source configured to have a supply voltage applied thereto, a drain connected to the drain of the cascode transistor, and a gate connected to the drain of the sixth transistor; and
    a seventh transistor having a source configured to have the supply voltage applied thereto, a drain connected to the drain of the fourth transistor, and a gate connected to the gate of the sixth transistor, the gates of the sixth transistor and the seventh transistor being connected to a gate of an eighth transistor for controlling the supply current of the oscillator circuit, wherein the gates of the sixth transistor, the seventh transistor, and the eighth transistor are thicker than the gates of the reference transistor, each copy transistor and the third transistor.

6. The circuit according to claim 5, wherein the eighth transistor has a source configured to have the supply voltage applied thereto and a drain connected to a supply input of the oscillator circuit.

7. The circuit according to claim 5, wherein the sixth transistor, the seventh transistor, and the eighth transistor are P-type metal-oxide gate field effect (PMOS) transistors.

8. The circuit according to claim 5, wherein the sixth transistor, the seventh transistor, and the eighth transistor have a gate thickness on the order of 50 Å.

9. The circuit according to claim 1, wherein the oscillator circuit comprises a loop of inverter circuits supplied with the supply current.

10. The circuit according to claim 9, wherein each inverter circuit of the oscillator circuit includes transistors having a gate thicker than the gates of the reference transistor, each copy transistor, and the third transistor.

11. The circuit according to claim 10, wherein the transistors of the oscillator circuit have a gate thickness on the order of 50 Å.

12. The circuit according to claim 1, wherein the reference transistor, each copy transistor, and the third transistor have a gate thickness on the order of 17 Å.

13. The circuit according to claim 1, wherein the fourth transistor and the cascode transistor have a gate thickness on the order of 50 Å.

14. A near field communication device comprising:
an accumulator;
an oscillator circuit;
a comparator having a first input coupled to the accumulator and a second input coupled to the oscillator circuit;
a regulator; and
a bias circuit coupled between the regulator and the oscillator circuit, the bias circuit comprising:
a current mirror comprising a reference transistor and a set of copy transistors that are programmable according to a digital word received as an input of the bias circuit;
a third transistor having a source connected to a cold spot, a drain, and a gate connected to the drain of the third transistor;
a fourth transistor having a source connected to the drain of the third transistor, a drain, and a gate connected to the drain of the fourth transistor; and
a cascode transistor having a source connected to a drain of at least one of the copy transistors, a drain, and a gate connected to the gate of the fourth transistor, wherein the gates of the fourth transistor and the cascode transistor are thicker than the gates of the reference transistor, each copy transistor, and the third transistor.

15. The device according to claim 14, wherein the gates of the fourth transistor and the cascode transistor are about three times thicker than the gates of the reference transistor, each copy transistor, and the third transistor.

16. The device according to claim 14, wherein the reference transistor has a source connected to the cold spot, a drain, and a gate connected to a current source, and wherein each copy transistor includes a gate connected to the gate of the reference transistor, a source connected to the cold spot, and a drain connected to the source of the cascode transistor, each copy transistor being configured to be turned on or off according to the digital word received as an input of the bias circuit.

17. The device according to claim 14, wherein the bias circuit further comprises:
a sixth transistor having a source configured to have a supply voltage applied thereto, a drain connected to the drain of the cascode transistor, and a gate connected to the drain of the sixth transistor; and
a seventh transistor having a source configured to have the supply voltage applied thereto, a drain connected to the drain of the fourth transistor, and a gate connected to the gate of the sixth transistor, the gates of the sixth transistor and the seventh transistor being connected to a gate of an eighth transistor for controlling a supply current of the oscillator circuit, wherein the gates of the sixth transistor, the seventh transistor, and the eighth transistor are thicker than the gates of the reference transistor, each copy transistor, and the third transistor.

18. The device according to claim 17, wherein the reference transistor, each copy transistor, the third transistor, the fourth transistor, and the cascode transistor are N-type metal-oxide gate field effect (NMOS) transistors and wherein the sixth transistor, the seventh transistor, and the eighth transistor are P-type metal-oxide gate field effect (PMOS) transistors.

19. The device according to claim 14, wherein the oscillator circuit comprises a loop of inverter circuits supplied with a supply current and wherein each inverter circuit of the oscillator circuit includes transistors having a gate thicker than the gates of the reference transistor, each copy transistor, and the third transistor.

20. A clock generator circuit comprising:
an oscillator circuit;
a bias circuit coupled to the oscillator circuit the bias circuit comprising:
a current mirror comprising a reference transistor and a set of copy transistors that are programmable according to a digital word received as an input of the bias circuit;
a third transistor having a source connected to a cold spot, a drain, and a gate connected to the drain of the third transistor;
a fourth transistor having a source connected to the drain of the third transistor, a drain, and a gate connected to the drain of the fourth transistor; and
a cascode transistor having a source connected to a drain of each copy transistor, a drain, and a gate connected to the gate of the fourth transistor;
wherein the gates of the fourth transistor and the cascode transistor are about three times thicker than the gates of the reference transistor, each copy transistor, and the third transistor; and
wherein each inverter circuit of the oscillator circuit includes transistors having a gate thicker than the gates of the reference transistor, each copy transistor, and the third transistor.

* * * * *